United States Patent
Saito et al.

(10) Patent No.: US 9,893,493 B2
(45) Date of Patent: Feb. 13, 2018

(54) SURFACE EMITTING QUANTUM CASCADE LASER

(71) Applicant: Kabushiki Kaisha Toshiba, Minato-ku (JP)

(72) Inventors: Shinji Saito, Yokohama (JP); Tsutomu Kakuno, Fujisawa (JP); Osamu Yamane, Yokohama (JP); Akira Tsumura, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/246,750

(22) Filed: Aug. 25, 2016

(65) Prior Publication Data

US 2017/0271849 A1    Sep. 21, 2017

(30) Foreign Application Priority Data

Mar. 15, 2016    (JP) .................................. 2016-051670

(51) Int. Cl.
*H01S 5/34* (2006.01)
*H01S 5/042* (2006.01)
*H01S 5/18* (2006.01)

(52) U.S. Cl.
CPC .......... *H01S 5/3402* (2013.01); *H01S 5/0425* (2013.01); *H01S 5/18* (2013.01)

(58) Field of Classification Search
CPC ......... H01S 5/3402; H01S 5/0425; H01S 5/18
See application file for complete search history.

(56) References Cited

U.S. PATENT DOCUMENTS

| | | |
|---|---|---|
| 2004/0247009 A1 | 12/2004 | Noda et al. |
| 2005/0063438 A1 | 3/2005 | Capasso et al. |
| 2009/0279579 A1 | 11/2009 | Ohnishi et al. |
| 2013/0003768 A1 | 1/2013 | Noda et al. |
| 2015/0053922 A1 | 2/2015 | Nakajima et al. |

(Continued)

FOREIGN PATENT DOCUMENTS

| | | |
|---|---|---|
| CN | 103633559 A | 3/2014 |
| JP | 2003-23193 A | 1/2003 |
| JP | 3561244 B2 | 6/2004 |

(Continued)

OTHER PUBLICATIONS

E. Mujagić, et al., "Low divergence single-mode surface emitting quantum cascade ring lasers", Applied Physics Letters, vol. 93 No. 16. XP012111946, Oct. 20, 2008, pp. 161101-1-161101-3.

(Continued)

*Primary Examiner* — Armando Rodriguez
(74) *Attorney, Agent, or Firm* — Oblon, McClelland, Maier & Neustadt, L.L.P.

(57) ABSTRACT

A surface emitting quantum cascade laser includes an active layer, a first semiconductor layer, and first electrode. The active layer has a plurality of quantum well layers stacked therein. The active layer is capable of emitting laser light by inter-subband transition. The first semiconductor layer is provided on the active layer and having a first surface provided with a plurality of pits so as to constitute a two-dimensional lattice. The first electrode is provided on the first semiconductor layer and having a periodic opening. Each pit is asymmetric with respect to a line parallel to a side of the lattice. The laser light is emitted in a direction generally perpendicular to the active layer from a pit exposed to the opening.

20 Claims, 10 Drawing Sheets

(56) References Cited

U.S. PATENT DOCUMENTS

2016/0020581 A1  1/2016  Hirose et al.

FOREIGN PATENT DOCUMENTS

| JP | 2006-156901 A | 6/2006 |
| JP | 2009-231773 | 10/2009 |
| JP | 2009-231773 A | 10/2009 |
| JP | 2009-295904 A | 12/2009 |
| JP | 2010-98135 A | 4/2010 |
| JP | 2011-108935 A | 6/2011 |
| JP | 2013-77756 A | 4/2013 |
| JP | 2014-197659 A | 10/2014 |
| WO | WO 2007/029538 A1 | 3/2007 |
| WO | WO 2010/087231 A1 | 8/2010 |
| WO | WO 2013/172269 A1 | 11/2013 |
| WO | 2014/136653 A1 | 9/2014 |
| WO | WO 2016/031965 A1 | 3/2016 |

OTHER PUBLICATIONS

Gangyi Xu, et al., "Surface-emitting Quantum Cascade Lasers with Metallic Photonic-crystal Resonators", Applied Physics Letters, American Institute of Physics, vol. 94, 2009, pp. 221101-1 to 221101-3 (reference previously filed submitting statement of relevancy only).

Office Action dated Oct. 6, 2016 in Japanese Patent Application No. 2016-051670 (with English translation).

Gangyi Xu, et al., "Surface-emitting Quantum Cascade Lasers with Metallic Photonic-crystal Resonators", Applied Physics Letters, American Institute of Physics, vol. 94, 2009, pp. 221101-1 to 221101-3.

Y. Chassagneux, et al. "Electrically Pumped Photonic-crystal Terahertz Lasers Controlled by Boundary Conditions", Nature, vol. 457, 2009, pp. 174-178.

Y. Wakayama, et al., "Design of Surface-Emitting Photonic Crystal Microcavitis for Quantum Cascade Lasers", Nano-Optoelectronics Workshop, 2007, pp. 126-127.

Dan-Yang Yao, et al., Surface Emitting Quantum Cascade Lasers Operating in Continuous-Wave Mode Above 70 C at 4.6µm, Applied Physics Letters, vol. 103, 2013, pp. 41121-1 to 41121-4.

Y. Wakayama, et al., "Design of High-Q Photonic Crystal Microcavities with Graded Square Lattice for Application to Quantum Cascade Lasers", Optics Express, vol. 16, No. 26, 2008, pp. 21321-21332.

Raffaele Colombelli, et al., "Quantum Cascade Surface-Emitting Photonic Crystal Laser", Science, vol. 302, 2003, pp. 1374-1377.

SURFACE EMITTING QUANTUM CASCADE LASER

CROSS-REFERENCE TO RELATED APPLICATIONS

This application is based upon and claims the benefit of priority from Japanese Patent Application No. 2016-051670, filed on Mar. 15, 2016; the entire contents of which are incorporated herein by reference.

FIELD

Embodiments described herein relate generally a surface emitting quantum cascade laser.

BACKGROUND

Lasing in the range of near-infrared to terahertz waves is difficult in recombination emission of holes and electrons.

A cascade connection of multi-quantum well structures enables lasing in the range of infrared to terahertz waves (30 GHz to 30 THz) by inter-subband transition of electrons.

In this case, in a Fabry-Perot laser with mirrors formed at the device edge surfaces, the thickness of the edge emission surface is small, and the optical density is high. This limits the increase of output power.

DETAILED DESCRIPTION

In general, according to one embodiment, a surface emitting quantum cascade laser includes an active layer, a first semiconductor layer, and first electrode. The active layer has a plurality of quantum well layers stacked therein. The active layer is capable of emitting laser light by inter-subband transition. The first semiconductor layer is provided on the active layer and having a first surface provided with a plurality of pits so as to constitute a two-dimensional lattice. The first electrode is provided on the first semiconductor layer and having a periodic opening. Each pit is asymmetric with respect to a line parallel to a side of the lattice. The laser light is emitted in a direction generally perpendicular to the active layer from a pit exposed to the opening.

Embodiments of the invention will now be described with reference to the drawings.

Figure 1:
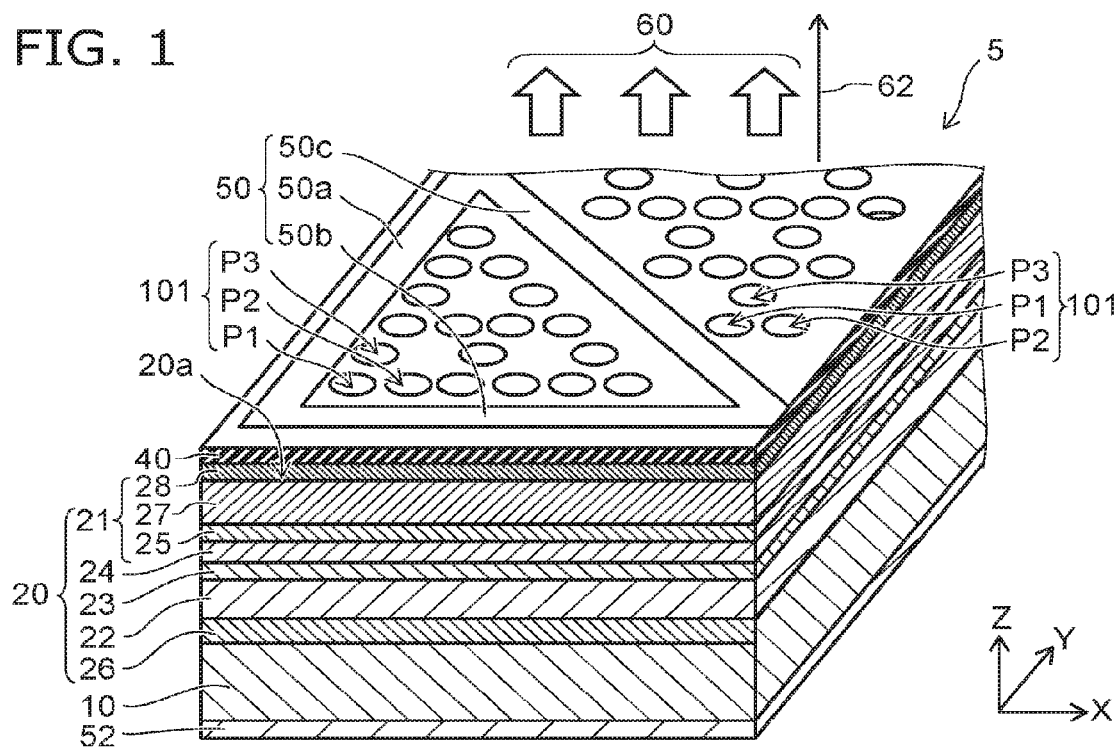
FIG. 1 is a partial schematic perspective view of a surface emitting quantum cascade laser according to a first embodiment of the invention.

FIG. 1 is a partial schematic perspective view of a surface emitting quantum cascade laser according to a first embodiment of the invention.

The surface emitting quantum cascade laser 5 includes a stacked body 20 and a first electrode 50. The stacked body 20 includes an active layer 24 and a first semiconductor layer 21. In the following, the quantum cascade laser is denoted by QCL.

The first semiconductor layer 21 includes e.g. a first cladding layer 27 and a first guide layer 25. The stacked body 20 may further include a second guide layer 23 and a second cladding layer 22. The refractive index of the first cladding layer 27 and the refractive index of the second cladding layer 22 are lower than any of the refractive indices of the first guide layer 25, the active layer 24, and the second guide layer 23. Thus, the laser light 60 is confined within the active layer 24 along the stacking direction (Z).

The active layer 24 has a configuration in which an inter-subband transition emission region and a relaxation region are alternately stacked. The inter-subband transition emission region is made of a quantum well layer including a well layer and a barrier layer. The quantum well includes e.g. a well layer made of Si-doped $In_{0.669}Ga_{0.331}As$ and a barrier layer made of Si-doped $In_{0.362}Al_{0.638}As$. More preferably, the quantum well layer has a multi-quantum well (MQW) structure in which at least two well layers and a plurality of barrier layers are further alternately stacked. The relaxation region can also include a quantum well layer.

The first semiconductor layer 21 is provided on the active layer 24. A plurality of pits 101 having opening ends at its first surface 20a are provided like a two-dimensional lattice and act as a periodic structure PC (photonic crystal). For instance, the pit 101 has a shape formed by cutting out a cylindrical region in the depth direction from the first surface 20a of the stacked body 20. The laser light 60 is mode-selected by the periodic structure PC. Furthermore, by the diffraction effect, the laser light 60 is emitted from the first surface 20a (serving as a light emission surface) along the optical axis 62 generally perpendicular to the first surface 20a. The cutout region may be a cone or a truncated cone.

The stacked body 20 can further include a first contact layer 28 and a buffer layer 26. For instance, the first contact layer 28 is electrically connected to the first electrode 50.

The buffer layer 26 is electrically connected to a second electrode 52 provided on the back surface of a substrate 10.

Figure 2:
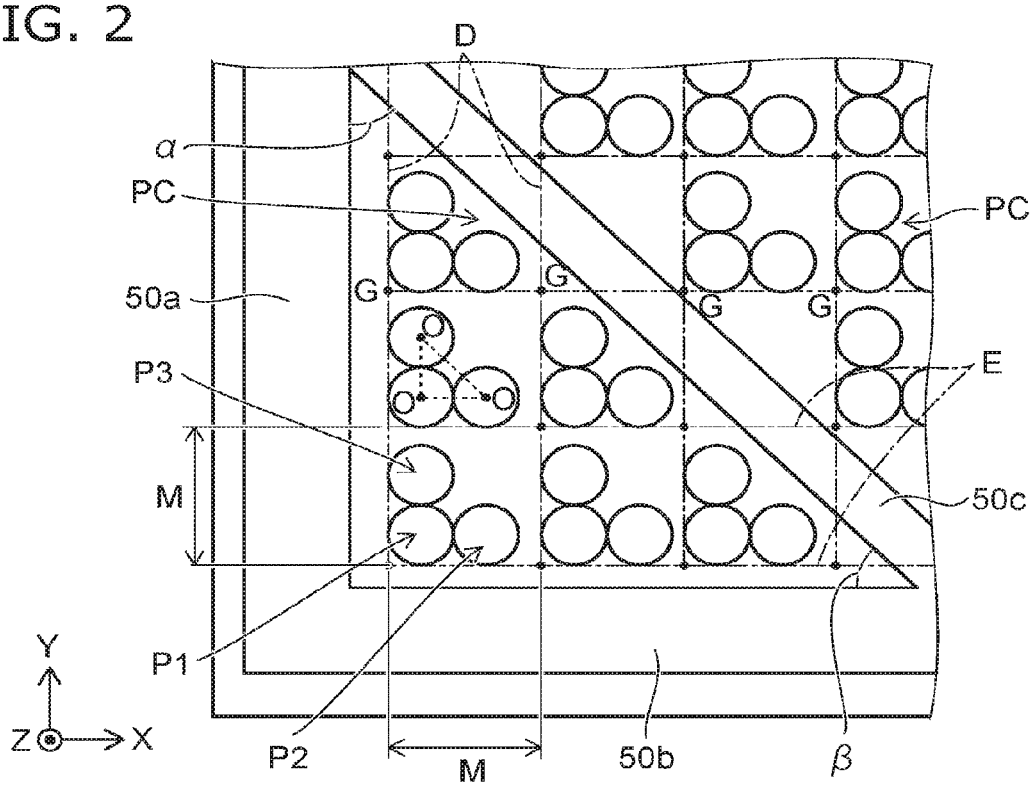
FIG. 2 is a partially enlarged schematic top view of the QCL according to the first embodiment.

FIG. 2 is a partially enlarged schematic top view of the QCL according to the first embodiment.

Figure 3:
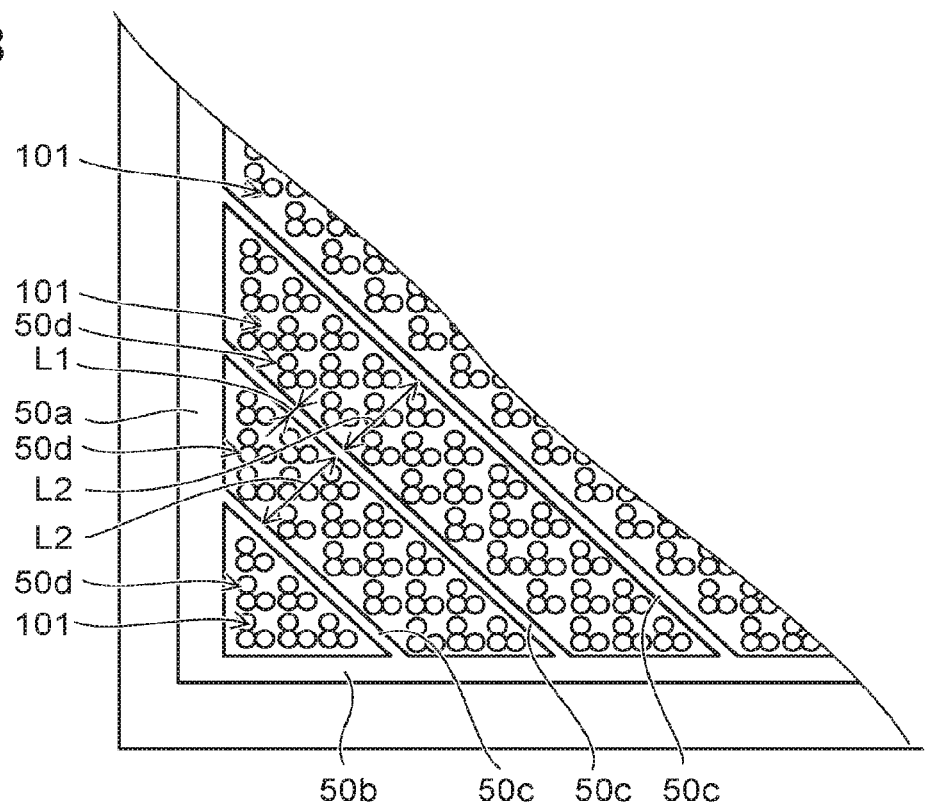
FIG. 3 is a partial schematic top view showing the arrangement of stripe parts of the first electrode.

FIG. 3 is a partial schematic top view showing the arrangement of stripe parts of the first electrode.

In the square lattice constituting the periodic structure PC (photonic crystal), a lattice point G is given by the intersection of two orthogonal sides D, E in the XY-plane. The lattice spacing is denoted by M. Each pit 101 is made linearly asymmetric with respect to one of the two sides D, E of the square lattice. The lattice does not need to be a square lattice, but may be a lattice with two orthogonal sides. The lattice may be a triangular lattice.

A current is passed along the stacking direction Z between the first electrode 50 and the second electrode 52 provided on the back surface of the substrate 10. Then, light is confined between the first cladding layer 27 and the second cladding layer 22. Furthermore, the periodic structure PC causes selection of the wavelength of stimulated emission and diffraction of light. The periodic structure PC acts as a band structure for passing a specific wavelength. Thus, the first semiconductor layer 21 can be referred to as photonic crystal.

In this case, optical anisotropy occurs when the pit 101 is linearly asymmetric with respect to two sides D, E of the square lattice. The laser light 60 can be emitted along the optical axis 62 orthogonal to the first surface 20a by suitably selecting e.g. the shape, arrangement, and depth of the pits 101. When the pit 101 is linearly symmetric with respect to two sides D, E of the square lattice, the laser light is emitted in a direction crossing the optical axis 62 orthogonal to the first surface 20a.

The first electrode 50 is provided on the first semiconductor layer 21. The first electrode 50 includes a frame part 50a, 50b and a plurality of stripe parts 50c with both end parts joined to the frame part 50a, 50b. The plurality of stripe parts 50c have a width L1. The plurality of stripe parts 50c cross obliquely (crossing angle α) the frame part 50a, and cross obliquely (crossing angle β) the frame part 50b. The plurality of stripe parts 50c have a pitch L2. The widths L1 of the plurality of stripe parts 50c are preferably equal. The pitches L2 between the plurality of stripe parts 50c are preferably equal. In this figure, it is assumed that α=β=45°. However, the invention is not limited thereto. The laser light 60 is emitted from the opening 50d of the first electrode 50. The periodic opening 50d of the first electrode 50 is asymmetric with respect to the lines parallel to the sides D, E of the lattice.

In the QCL of the first embodiment, regions P1, P2, P3 each have a shape formed by cutting out a cylinder. The regions P1, P2, P3 are arranged so that the centers O of the three cylinders form a right triangle. The QCL is provided with pits 101 for diffracting light in the direction orthogonal to the stacking direction (Z) of the stacked body 20 including the active layer 24, the first cladding layer 27, and the second cladding layer 22. Thus, the QCL has the function of diffracting light generated in the active layer 24.

When a current is passed in this QCL, the first cladding layer 27 and the second cladding layer 22 constitute a waveguide structure and confines light in the active layer 24. The periodic pits 101 cause wavelength selection and interference of stimulated emission. Here, the periodic pits 101 are provided so that light can be extracted in a direction crossing the lasing direction. Thus, the light generated in the active layer 24 can be extracted outside through the pits 101. This enables emission of the laser light 60 in the direction along the optical axis 62. The optical axis 62 is in a direction generally perpendicular to the active layer 24. In this description, the generally perpendicular direction refers to 81 degrees or more and 99 degrees or less with respect to the surface of the active layer 24.

The pit 101 is shaped like a cylinder. Three pits 101 arranged with centers O forming a right triangle constitute a unit. Such units are arranged in a square lattice. This arrangement allows the light guided in the plane to be emitted in the direction perpendicular to the plane.

In the QCL, the polarization direction is TM (transverse magnetic) polarization parallel to the surface of the active layer 24. In resonator mirrors sandwiching the active layer between the front surface and the back surface like a p-n junction surface emitting laser, the polarization coincides with the traveling direction of light. Thus, no stimulated emission occurs. That is, it is impossible to realize a VCSEL (vertical cavity surface emitting laser).

In contrast, in the QCL according to the first embodiment, the traveling direction of stimulated emission light is parallel to the surface of the active layer 24. This enables resonance and amplification of the stimulated emission light. Furthermore, in a periodic structure with anisotropy, the stimulated emission light can be extracted in a direction generally perpendicular to the surface of the active layer 24. That is, a surface emitting laser can be realized in a longer wavelength region than the mid-infrared region, which can be realized by only the QCL so far.

The surface emitting laser does not need formation of a resonator by cleavage like the edge emitting laser. This can prevent the decrease of yield due to cleavage. Furthermore, in the edge emitting laser, the resonator is formed only by cleavage. Thus, inspection needs to be performed after cleavage. This increases inspection cost compared with e.g. LED, which can be subjected to inspection by e.g. an automatic prober in the wafer state. In contrast, the QCL according to the first embodiment can be subjected to characterization by an automatic prober in the wafer state. Thus, a great effect of cost reduction can be expected in terms of inspection cost and yield. This facilitates price reduction and volume production of QCL, which has been expensive so far.

Furthermore, typically in a semiconductor laser, electrodes need to be formed above and below the light emitting layer. In the surface emitting case, the electrode is located in the light emission direction and hampers extraction of light. In the first embodiment, the electrode is placed with a width smaller than the wavelength in the region where no pit 101 exists. This can achieve compatibility between current injection and extraction of laser light. As shown in FIG. 3, the first electrode 50 includes a stripe part 50c forming an angle of e.g. generally 45 degrees with the square lattice in which three cylinders are arranged. Such arrangement of the electrode enables formation of the electrode with the maximum width by providing a region where the unit of three cylinders arranged in a square lattice is not formed in one row in the direction of 45 degrees. This can ensure a large contact area, reducing the contact resistance at the metal-semiconductor interface and reducing the operation voltage of the QCL. In this description, forming an angle of generally 45 degrees with the square lattice means that the angle is 40 degrees or more and 50 degrees or less with respect to one side of the square lattice.

Figure 4:
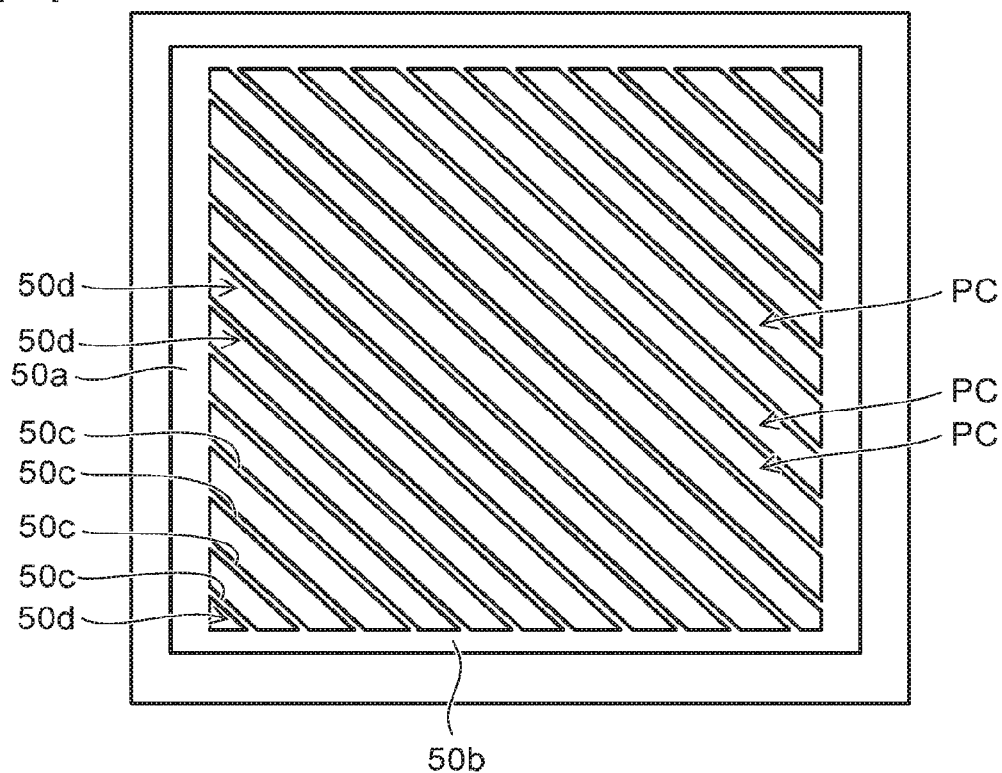
FIG. 4 is a schematic plan view showing the electrode arrangement of the device.

FIG. 4 is a schematic plan view showing the electrode arrangement of the device.

The region in which the stripe part 50c is obliquely provided is not limited to FIGS. 1 to 3. Unlike FIG. 3, one out of four repeated units may be used as a region for forming the electrode. Alternatively, this region for forming the electrode can be made of one out of two units of cylinders, each unit made of three cylinders.

Figure 5:
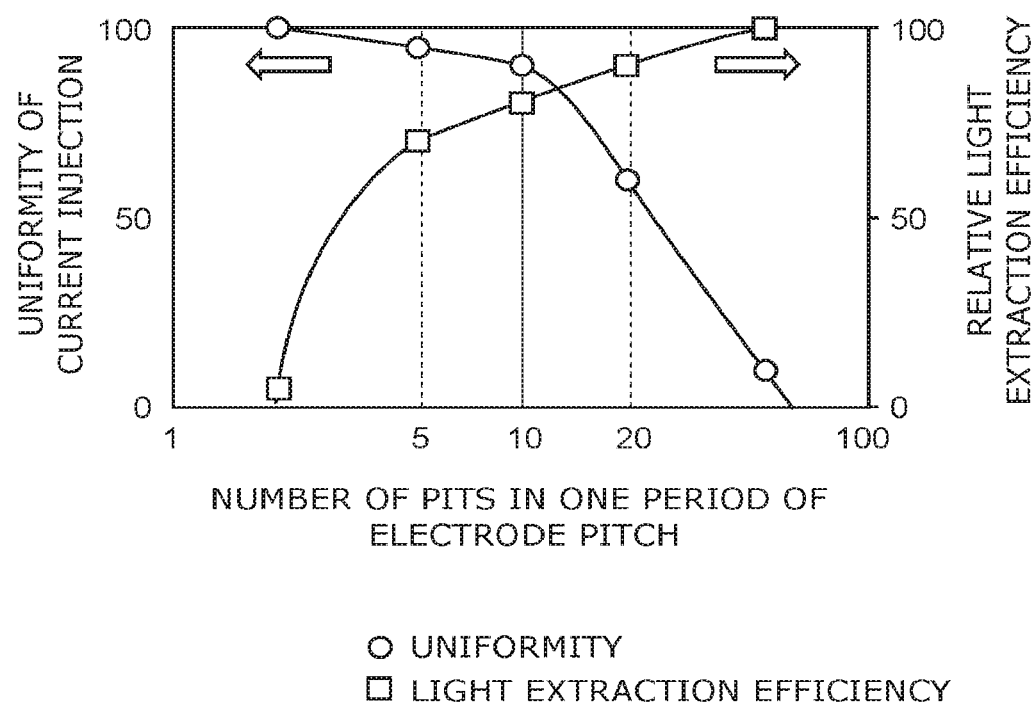
FIG. 5 is a graph of the uniformity of current injection and the relative light extraction efficiency versus the number of pits in one period of the electrode stripe part.

FIG. 5 is a graph of the uniformity of current injection and the relative light extraction efficiency versus the number of pits in one period of the electrode stripe part.

The horizontal axis represents the number of pits in one period of the electrode stripe part. The vertical axis represents the uniformity of current injection and the relative light extraction efficiency. The uniformity of current injection is normalized to 100 in the case where two pits are contained in one period along the direction orthogonal to the stripe part $50c$ of the electrode 50 having one-dimensional periodic structure. The relative light extraction efficiency is normalized to 100 in the case where 50 pits are contained in one period along the direction orthogonal to the stripe part $50c$ of the electrode 50 having one-dimensional periodic structure.

With the increase in the number of pits 101 in one period along the direction orthogonal to the stripe part $50c$, the uniformity of current injection decreases, but the relative light extraction efficiency increases. That is, when the number of pits 101 in one period is set to 5 or more and 20 or less, compatibility is achieved between the uniformity of current injection and the extraction efficiency of laser light. Thus, an optimal solution is determined from the relationship between the opening area of the first electrode 50 and the current injection efficiency, and from the influence of the periodic structure of the first electrode 50 on the diffraction effect in light extraction.

Figure 6:
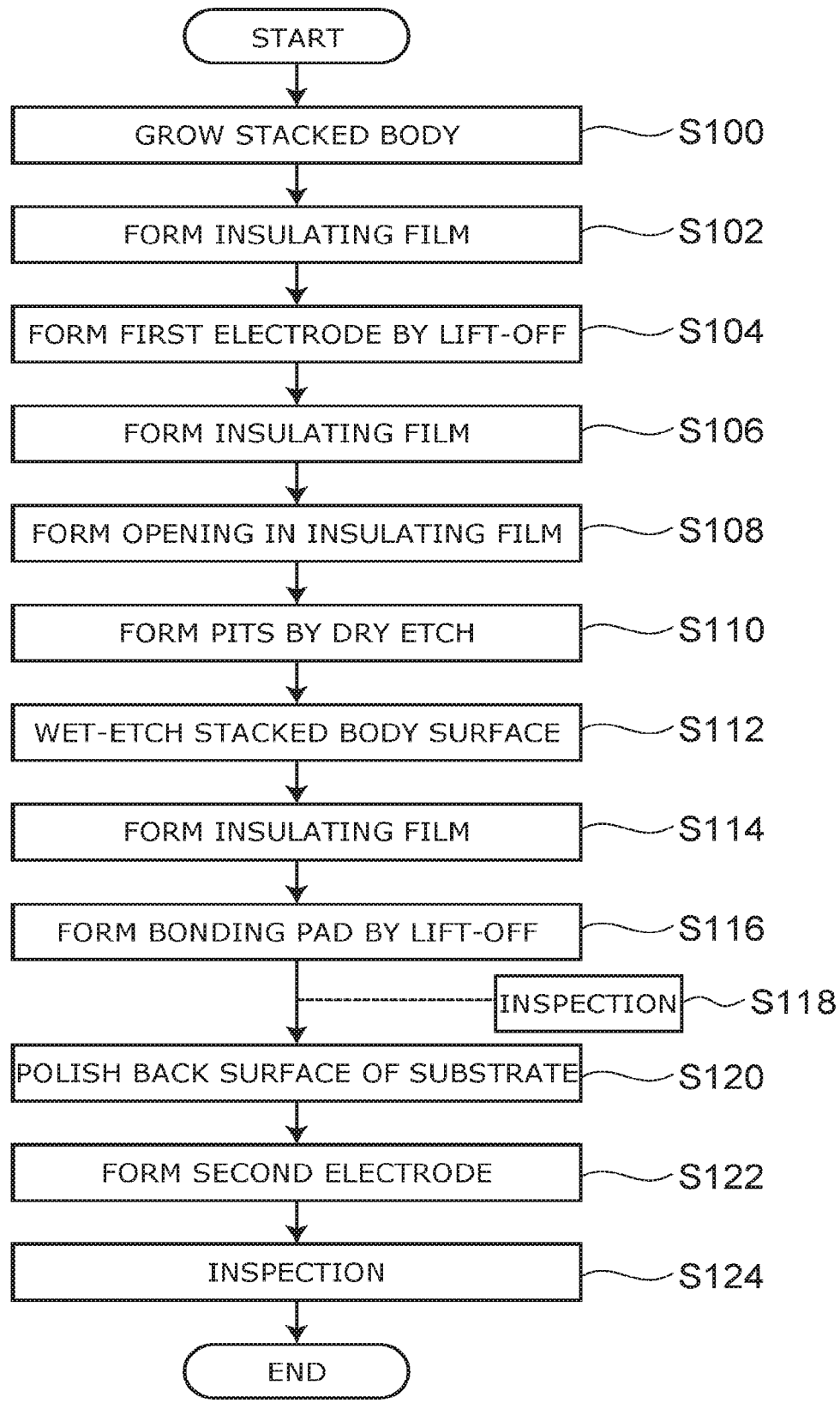
FIG. 6 is a flow chart of a method for manufacturing the surface emitting QCL according to the first embodiment.

FIG. 6 is a flow chart of a method for manufacturing the surface emitting QCL according to the first embodiment.

A substrate 10 made of n-type InP is placed in a crystal growth apparatus. Crystal growth is performed on this substrate 10 by e.g. MBE (molecular beam epitaxy) method. Thus, a buffer layer 26 made of Si-doped n-type InGaAs, a second cladding layer 22 made of Si-doped n-type InP, a second guide layer 23 made of undoped InGaAs, an active layer 24 made of a multi-quantum well including a well layer made of $In_{0.669}Ga_{0.331}As$ and a barrier layer made of $In_{0.362}Al_{0.638}As$, a first guide layer 25 made of undoped InGaAs, a first cladding layer 27 made of Si-doped n-type InP, and a first contact layer 28 made of Si-doped n-type InGaAs are crystal grown in this order (S100).

The active layer 24 is designed by combination of quantum well layers different in thickness so that the quantum levels overlap each other during operation. For instance, 40 sets of quantum well layers, each set made of 20 quantum well layers, can be stacked into a stacked structure.

Next, the substrate 10 subjected to crystal growth is taken out of the crystal growth apparatus. An insulating film 40 such as $SiO_2$ is formed on the first contact layer 28 (S102). A resist pattern for forming a first electrode is formed on the surface of the insulating film 40. The first electrode 50 is formed on the region where no photoresist pattern is provided. In the case where the insulating film 40 is made of $SiO_2$, the insulating film 40 is etched away with e.g. ammonium fluoride solution. In this state, the wafer is introduced into an electron beam evaporation apparatus to evaporate electrode metal Ti/Al. The wafer is taken out of the evaporation apparatus. The photoresist is removed with a remover liquid. Thus, the first electrode 50 is formed by spacer lift-off (S104).

Next, an insulating film (not shown) is stacked again (S106). Then, a photoresist is applied to form a square lattice pattern with three circles arranged therein. The insulating film is patterned by wet etching using this photoresist pattern. An opening made of three circles is formed in the insulating film (S108).

The photoresist is removed. Then, the insulating film is used as a mask to form pits 101 by dry etching to the middle of the first cladding layer 27 (S110). Furthermore, the surface of the stacked body 20 is removed approximately 10 nm by wet etching to remove the damage layer caused by the dry etching (S112).

An insulating film is stacked again to cover the portion where the stacked body 20 is exposed (S114). A photoresist is applied to form a pattern opened only in the portion for forming a bonding pad (not shown). Only the insulating film of that portion is removed. In this state, the wafer is introduced into the electron beam evaporation apparatus to evaporate electrode metal Ti/Pt/Au. The wafer is taken out of the evaporation apparatus. The photoresist is removed. Thus, a bonding pad can be formed from the electrode metal remaining in the electrode formation region (S116). Accordingly, the wafer step is completed.

Next, each device can be inspected by passing a current using e.g. a prober. The inspection can be performed in the state close to the product. Next, the back surface of the substrate 10 is thinned to approximately 100 μm by polishing (S120). Then, the wafer is introduced into the electron beam evaporation apparatus to evaporate a second electrode metal Ti/Pt/Au on the wafer back side (S122). The inspection may be performed by bringing the back surface side of the substrate 10 into contact with metal (S124) after the step of forming the second electrode (S122).

Next, scribing for dicing is performed from the surface opposite from the substrate side. The scribing is performed in the size of each device. The device is divided by a breaking machine. The wafer is stuck to a stretch adhesive sheet at the time of the scribing. After the breaking, the sheet is stretched to expand the space between the devices. This improves the pickup capability of the device. Finally, in this state, total inspection is performed by a prober. Some of the inspections performed previously may be performed in this step. The device is picked up from the adhesive sheet and mounted on a heat sink made of e.g. CuW. The mounting is performed by screening the devices using the data of the inspection step. This enables production with high yield. Bonding for the mounting may use AuSn. Ag is more preferable because of its good thermal conductivity. Thus, the number of process steps is small, and the time required for inspection can be reduced.

The device mounted on the heat sink was measured. A single-mode output of 100 mW was obtained at a wavelength of 4.355 μm. On the other hand, the device of the edge emission type failed to operate in the single mode under high-current injection for obtaining high output power. The laser light emitted from the QCL had a plurality of peaks. This made it difficult to obtain high output power.

Figure 7:
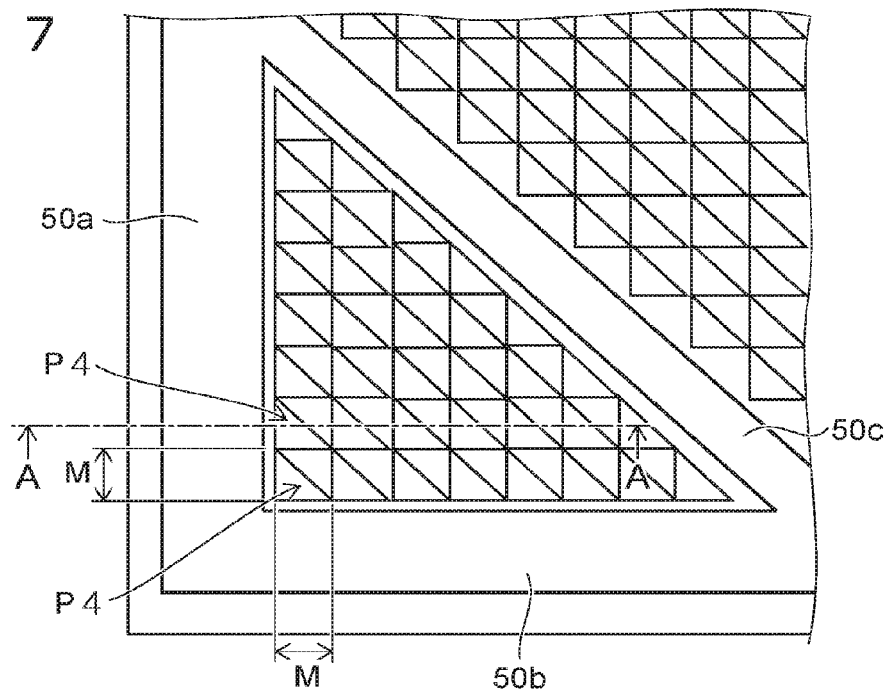
FIG. 7 is a partially enlarged schematic top view of a surface emitting quantum cascade laser according to a second embodiment.

FIG. 7 is a partially enlarged schematic top view of a surface emitting quantum cascade laser according to a second embodiment.

Figure 8:
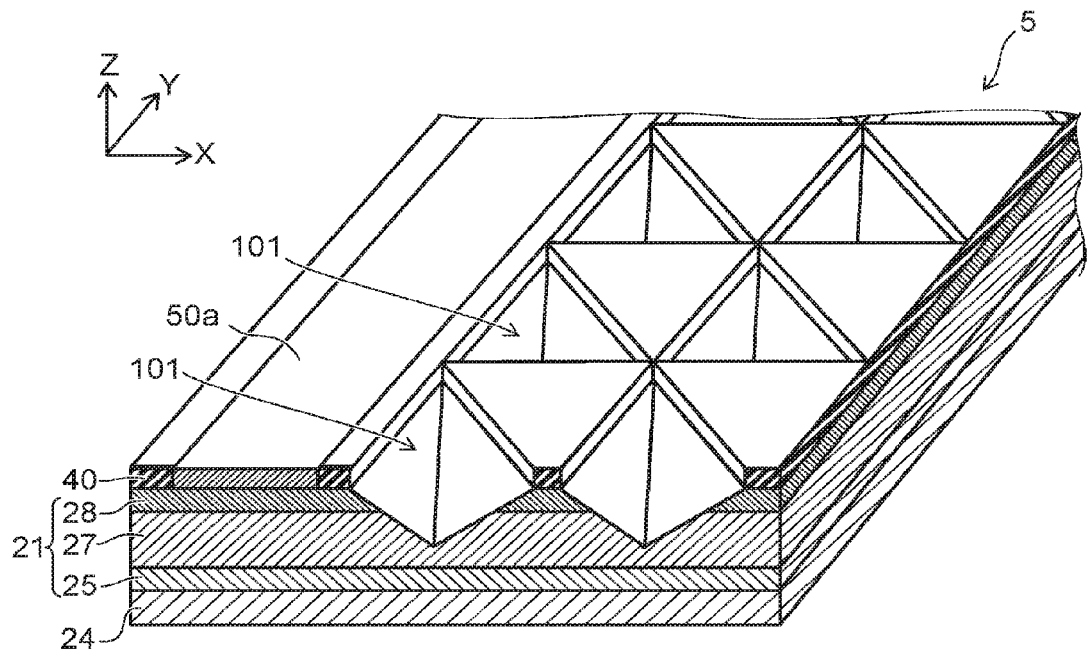
FIG. 8 is a schematic perspective view cut along line A-A of FIG. 7.

FIG. 8 is a schematic perspective view cut along line A-A of FIG. 7. The surface emitting quantum cascade laser of the second embodiment is identical in composition to the stacked body 20 of the first embodiment.

The pit 101 has a shape formed by cutting out a triangular pyramid or a truncated triangular pyramid downward from the first surface 20a side of the stacked body 20. In FIG. 7, the opening end of the pit 101 is shown by a right triangle. The two sides containing the right angle are parallel to the two sides of the frame part 50a, 50b, respectively. The hypotenuse is parallel to the stripe part 50c of the first electrode 50.

Next, a method for manufacturing the semiconductor light emitting device of this embodiment is described.

The steps up to the step of forming an insulating film (S106) shown in FIG. 6 are the same as those of the first embodiment. After the step of forming an insulating film (S106), a resist pattern of the right triangle is formed. An insulating film 40 such as SiO$_2$ is wet etched. Thus, an opening (not shown) is formed in the insulating film 40.

After removing the photoresist, the insulating film 40 is used as a mask to form pits 101 by wet etching to the middle of the first cladding layer 27. The pit 101 is a region formed by cutting out a triangular pyramid. Step 114 and the following steps shown in FIG. 6 are generally the same as those of the first embodiment.

Figure 9:
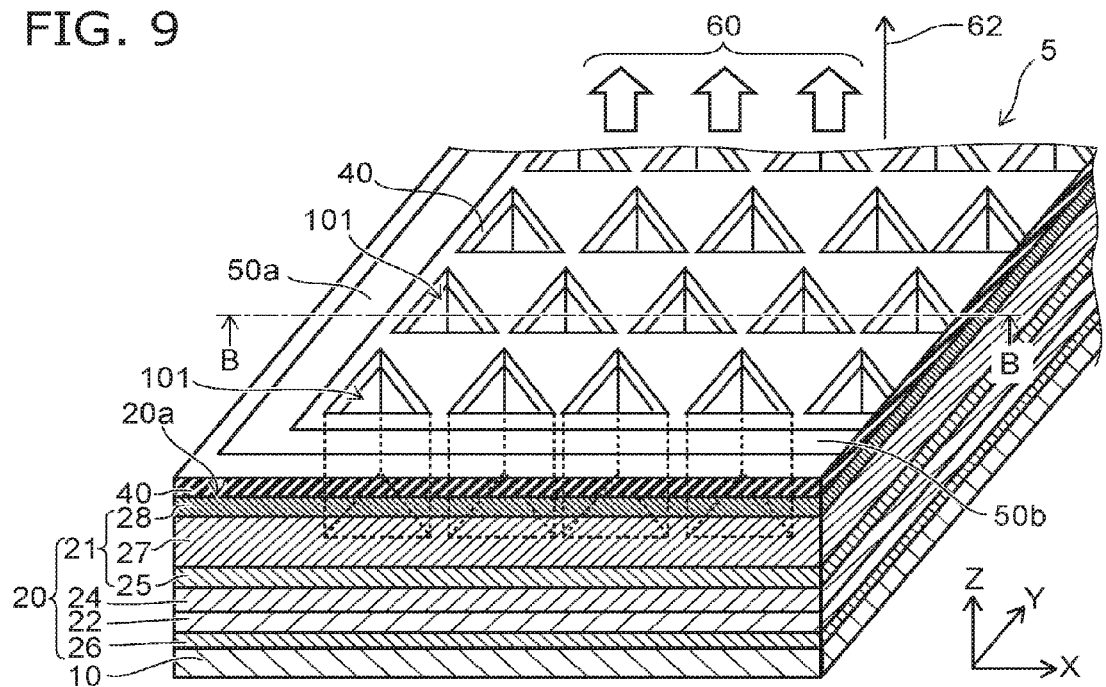
FIG. 9 is a partial schematic perspective view of a surface emitting quantum cascade laser according to a third embodiment.

FIG. 9 is a partial schematic perspective view of a surface emitting quantum cascade laser according to a third embodiment.

The pit 101 has a shape formed by cutting out a triangular prism. The pits 101 are arranged in a square lattice. This arrangement allows the light guided along the first surface 20a to be emitted in the direction of the optical axis 62 perpendicular to the first surface 20a.

Figure 10A:
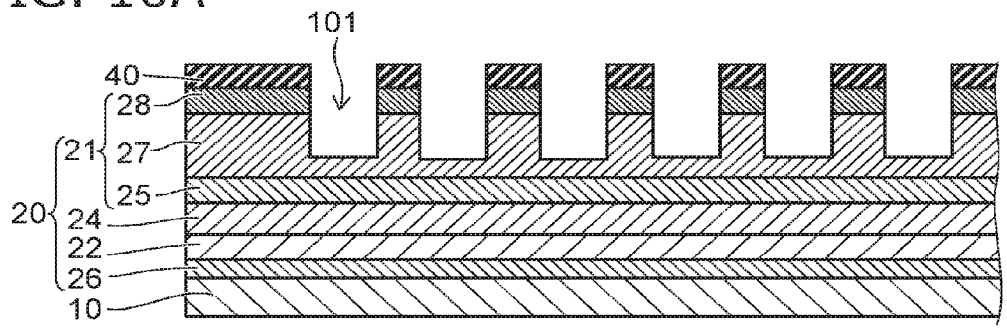
FIG. 10A is a schematic sectional view taken along line B-B of FIG. 9 after pit formation.
Figure 10B:
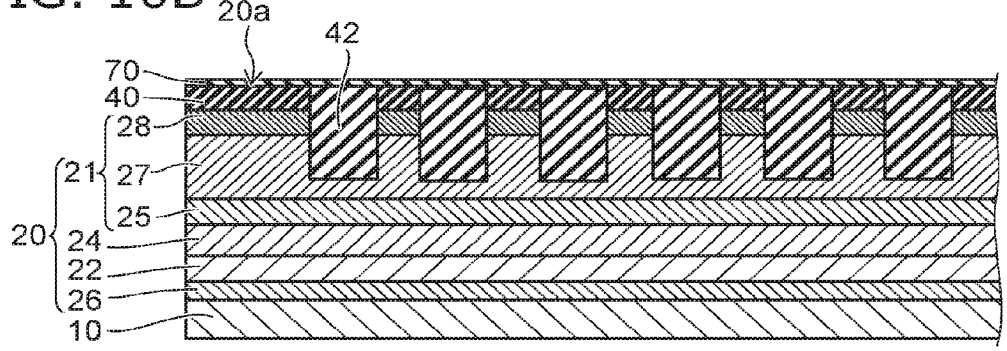
FIG. 10B is a schematic sectional view taken along line B-B of FIG. 9 after electrode formation.

FIG. 10A is a schematic sectional view taken along line B-B of FIG. 9 after pit formation. FIG. 10B is a schematic sectional view taken along line B-B of FIG. 9 after electrode formation.

As shown in FIG. 10A, pits 101 are formed by the surface wet etching process (S112) shown in FIG. 6. A CVD (chemical vapor deposition) apparatus is used to fill the pits 101 with an insulating film 42 such as SiO$_2$. Then, dry etching is performed so that the thickness of the insulating film 42 is made equal to the depth of the pits.

Furthermore, as shown in FIG. 10B, a metal containing Au is evaporated so as to cover the generally flat surface composed of the surface of the insulating film 42 and the first surface 20a. The metal constitutes a first electrode 70. Ti/Au may be provided in the outer peripheral part. This achieves better adhesiveness than in the case of only Au. Furthermore, for instance, sintering may be performed in a nitrogen atmosphere. This further increases adhesiveness because of alloying of Au and InGaAs.

Figure 11A:
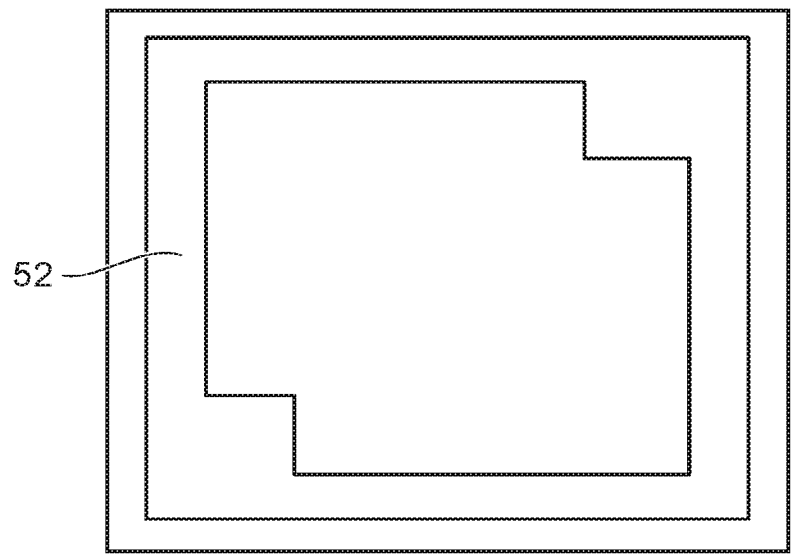
FIG. 11A is a schematic bottom view of a QCL device according to the third embodiment.
Figure 11B:
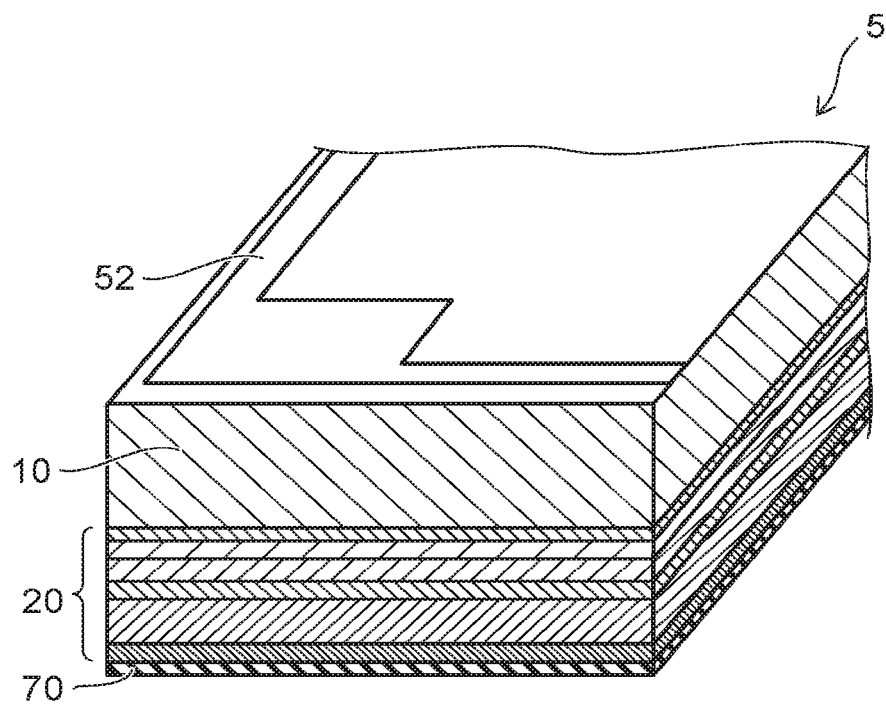
FIG. 11B is a schematic perspective view of the QCL device as viewed from the substrate side.

FIG. 11A is a schematic bottom view of a QCL device according to the third embodiment. FIG. 11B is a schematic perspective view of the QCL device as viewed from the substrate side.

After the steps shown in FIGS. 10A and 10B, the substrate 10 is thinned to approximately 100 μm by polishing. A photoresist is applied and subjected to patterning exposure at the surface of the QCL by a two-sided mask aligner. The wafer is introduced into the electron beam evaporation apparatus. Then, electrode metal Ti/Pt/Au is evaporated to form a second electrode 52 in the outer peripheral part so as not to hamper extraction of light.

Next, scribing for dicing is performed from the surface on the side opposite from the substrate. The scribing is performed in the prescribed size of each device. The device is divided by a breaking machine. The wafer is stuck to a stretch adhesive sheet at the time of the scribing. After the breaking, the sheet is stretched to expand the space between the devices. This improves the pickup capability of the device. Finally, in this state, total inspection is performed by a prober.

Figure 12A:
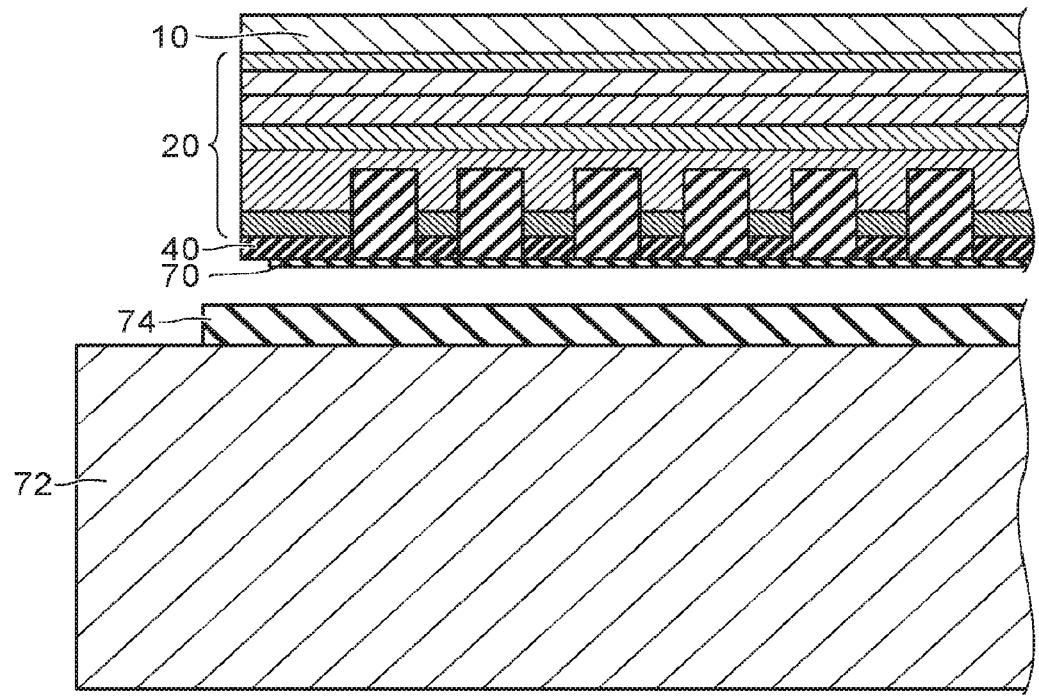
FIGS. 12A and 12B are schematic sectional views describing the assembly process of the QCL device.
Figure 12B:
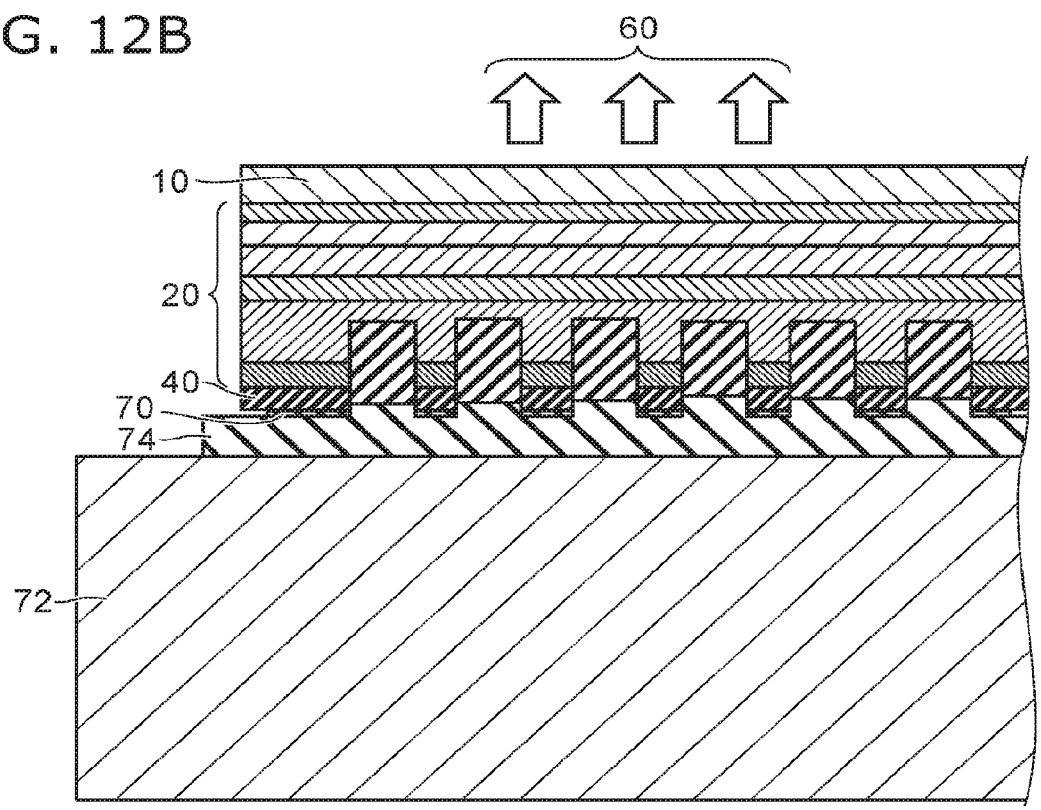

FIGS. 12A and 12B are schematic sectional views describing the assembly process of the QCL device.

The QCL device is picked up from the adhesive sheet. The first electrode 70 on the surface opposite from the substrate 10 is opposed (FIG. 12A) and bonded (FIG. 12B) to the conductive part 74 on the heat sink 72 made of e.g. CuW. The third embodiment provides a structure in which light is reflected by the first electrode 70 and extracted from the substrate 10 side. The bonding may be based on AuSn. However, Au nanoparticle paste is more preferable because of its good thermal conductivity.

Figure 13:
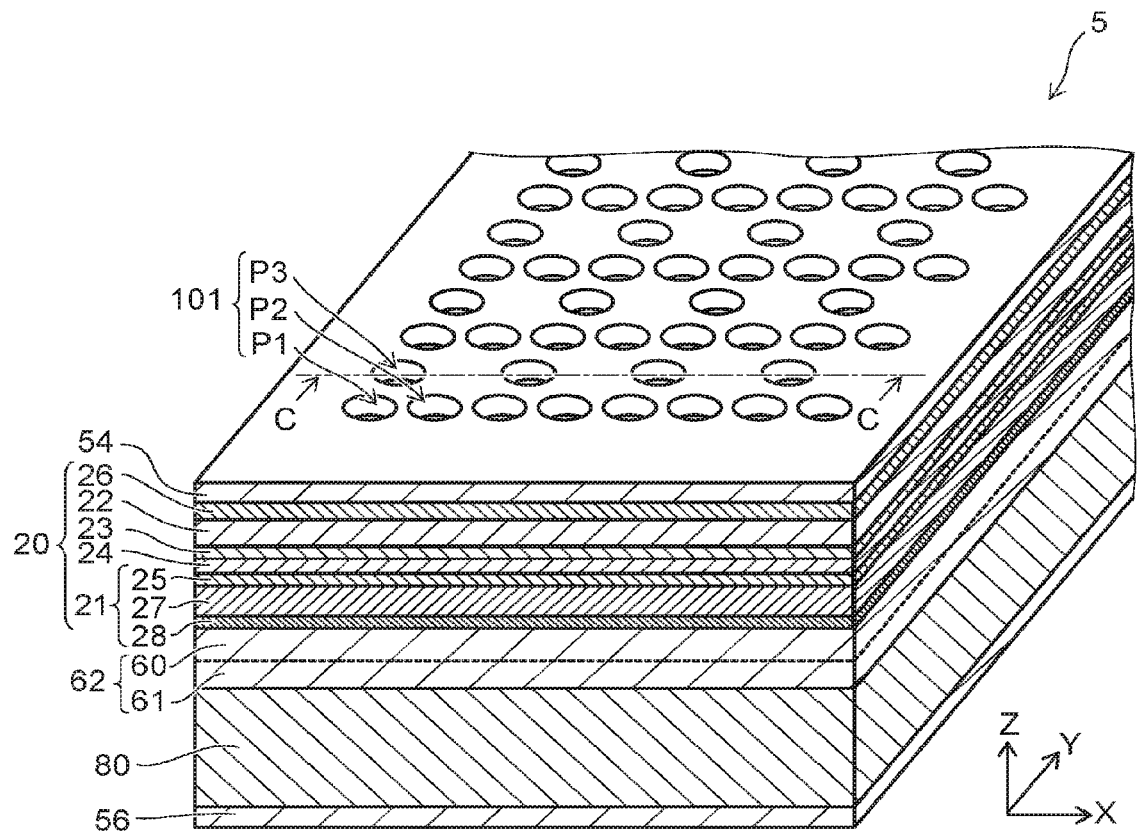
FIG. 13 is a partial cutaway schematic perspective view of a quantum cascade laser according to a fourth embodiment.

FIG. 13 is a partial cutaway schematic perspective view of a quantum cascade laser according to a fourth embodiment.

Figure 14:
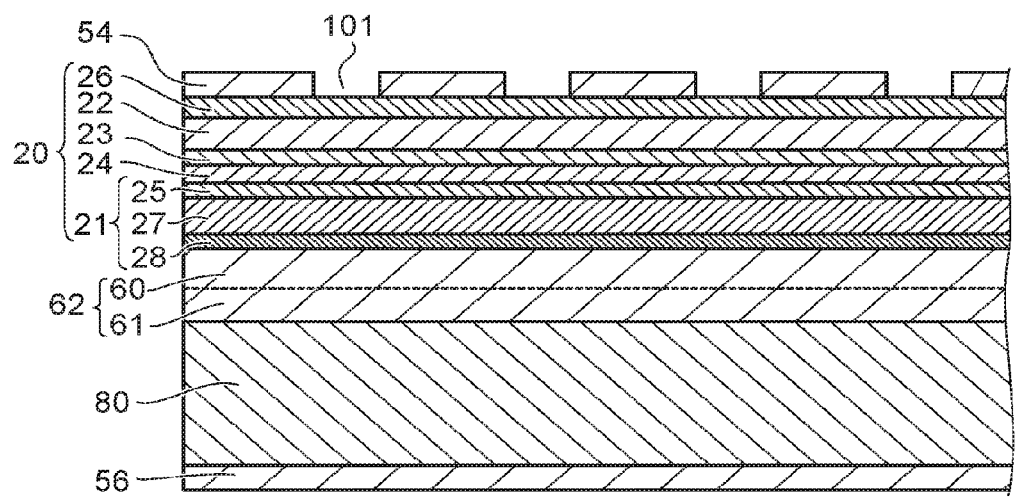
FIG. 14 is a schematic sectional view taken along line C-C of FIG. 13.

FIG. 14 is a schematic sectional view taken along line C-C of FIG. 13.

The pits 101 have a cylindrical shape formed by cutting out three prescribed regions P1, P2, P3. As shown in FIG. 13, three circular regions with the centers of the circles constituting a right triangle constitute a unit. Such units are arranged in a square lattice. This arrangement allows the light guided in the plane to be emitted in the direction perpendicular to the surface of the active layer 24.

Next, a method for manufacturing the QCL according to the fourth embodiment is described. First, a substrate (not shown) made of n-type InP is placed in a crystal growth apparatus. Crystal growth is performed on the substrate by MBE method. Thus, a buffer layer 26 made of Si-doped n-type InGaAs, a second cladding layer 22, a second light guide layer 23, an active layer 24, a first light guide layer 25, a first cladding layer 27, and a first contact layer 28 made of Si-doped n-type InGaAs are crystal grown in this order.

Next, the wafer is taken out of the crystal growth apparatus. An electrode 60 made of a Ti/Pt/Au layer is formed on the first contact layer 28. Furthermore, another substrate 80 made of InP is prepared, and a Ti/Pt/Au layer 61 is formed on the surface thereof. The Ti/Pt/Au layers of these two wafers are joined in a vacuum with the crystal orientation aligned with each other. Then, the wafers are heated for wafer bonding. This bonding is referred to as Au—Au bonding. The wafers are bonded by a bonding metal layer 62.

Next, the front surface side of the bonded wafer is thinned to approximately 10 μm by polishing, and then removed with hydrochloric acid. The etching stops at the buffer layer 26 because InGaAs is not etched with hydrochloric acid. This wafer is introduced into an electron beam evaporation apparatus to evaporate Ti/Au. The wafer is taken out of the electron beam evaporation apparatus and patterned with a photoresist. The pattern is circular. Three circles with the centers of the circles arranged in a right triangle constitute a unit. Such units are arranged in a square lattice.

Next, the patterned wafer is introduced into a dry etching apparatus. Pits 101 are formed by etching Ti/Au. The stacked body 20 exposed through the pits provided in the first electrode 54 can be further provided with pits by e.g. dry etching. The wafer is taken out of the dry etching apparatus. Next, the substrate 80 is thinned to approximately 100 μm by polishing. Then, the wafer is introduced into the electron beam evaporation apparatus to evaporate electrode metal Ti/Pt/Au. Thus, a second electrode 56 is formed.

Figure 15A:
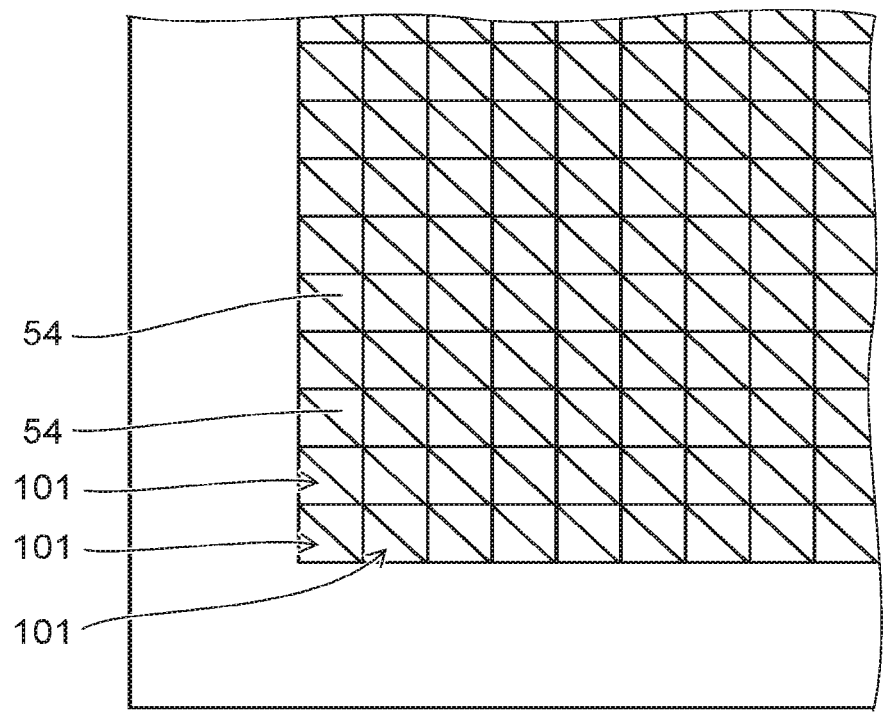
FIG. 15A is a partial schematic top view of a QCL according to a first variation of the fourth embodiment.
Figure 15B:
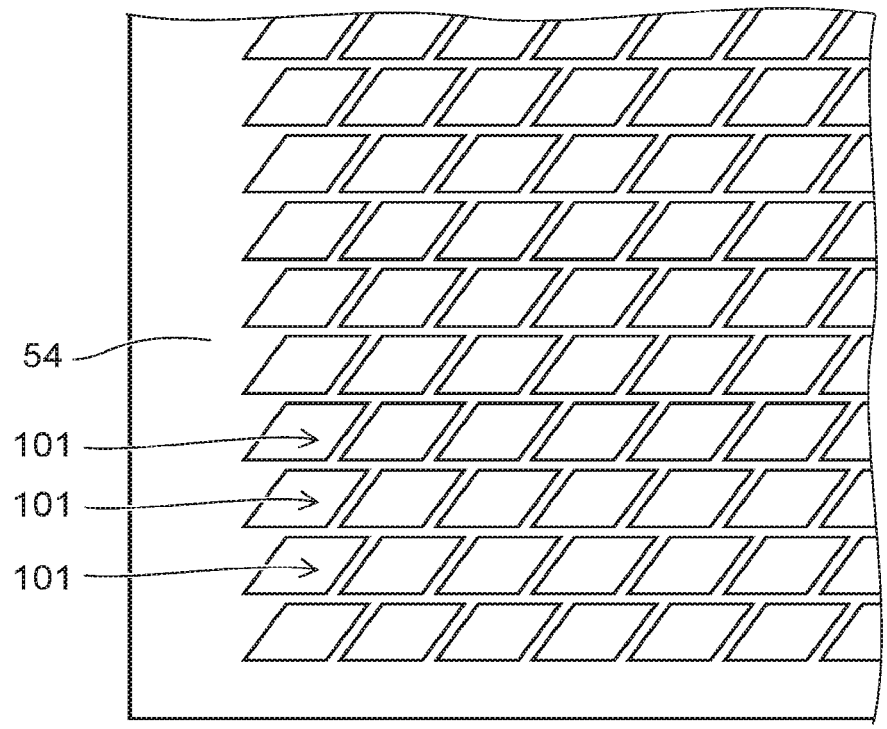
FIG. 15B is a partial schematic top view of a QCL according to a second variation of the fourth embodiment.

FIG. 15A is a partial schematic top view of a QCL according to a first variation of the fourth embodiment. FIG. 15B is a partial schematic top view of a QCL according to a second variation of the fourth embodiment.

The pit 101 may be shaped like e.g. a triangle (FIG. 15A), rhombus (FIG. 15B), or parallelogram in plan view.

The interface between the first electrode 50 and the first semiconductor layer 21 may be a plasmon waveguide in FIG. 1. For instance, laser light may be a terahertz wave. Then, the interface between the first electrode 50 and the first semiconductor layer 21 can be a surface plasmon waveguide. Thus, the real part of the dielectric constant of the first electrode 50 becomes negative, and the refractive index can be made imaginary. In this case, the laser light does not travel into the first electrode 50. Thus, the laser light can be confined without providing a cladding layer.

The first to fourth embodiments and the variations associated therewith provide a surface emitting quantum cascade laser that easily achieves higher output power in the wavelength band of infrared to terahertz waves. Such surface emitting quantum cascade lasers can be widely used for e.g. laser processing, environmental measurement, and breath analysis.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A surface emitting quantum cascade laser comprising:
    an active layer with a plurality of quantum well layers stacked therein, the active layer being capable of emitting laser light by inter-subband transition;
    a first semiconductor layer provided on the active layer and having a first surface provided with a plurality of pits so as to constitute a two-dimensional lattice; and
    a first electrode provided on the first semiconductor layer and having a periodic opening,
    each pit being asymmetric with respect to a line parallel to a side of the lattice, and
    the laser light being emitted in a direction generally perpendicular to the active layer from a pit exposed to the opening.

2. The laser according to claim 1, wherein the two-dimensional lattice is composed of pits having a shape formed by cutting out a prescribed region of the first semiconductor layer in depth direction from the first surface.

3. The laser according to claim 2, wherein the prescribed region includes one of a cylinder, a cone, an m-gonal prism (m being an integer of 3 or more) and an n-gonal pyramid (n being an integer of 3 or more).

4. The laser according to claim 2, wherein the prescribed region includes a plurality of cylinders or a plurality of cones.

5. The laser according to claim 1, wherein
    the first electrode includes a frame part and a plurality of stripe parts with both end parts joined to the frame part, and
    the plurality of stripe parts are arranged parallel to each other with a prescribed pitch and obliquely cross the frame part.

6. The laser according to claim 5, wherein the opening of the first electrode is asymmetric with respect to a line parallel to a side of the lattice.

7. The laser according to claim 1, wherein the two-dimensional lattice is a square lattice.

8. The laser according to claim 5, wherein the two dimensional lattice is a square lattice and two sides of the square lattice are orthogonal to the two sides of the frame part, respectively.

9. The laser according to claim 8, wherein the two sides of the frame part each cross the stripe part at generally 45 degrees.

10. The laser according to claim 5, wherein the stripe part is provided in a non-formation region of the pits.

11. A surface emitting quantum cascade laser comprising:
    an active layer with a plurality of quantum well structures stacked therein, the active layer being capable of emitting laser light by inter-subband transition;
    a first semiconductor layer provided on the active layer and having a first surface provided with a plurality of pits so as to constitute a two-dimensional lattice;
    an insulating film filled in the plurality of pits and having a thickness equal to depth of the pits; and
    a first electrode covering the first surface of the first semiconductor layer and an upper surface of the insulating film and reflecting the laser light to the active layer side,
    each pit being asymmetric with respect to a line parallel to one side of the two-dimensional lattice, and
    the laser light reflected by the first electrode passing through the active layer and being emitted in a direction generally perpendicular to the active layer.

12. The laser according to claim 11, wherein the two-dimensional lattice is composed of pits having a shape formed by cutting out a prescribed region of the first semiconductor layer in depth direction from the first surface.

13. The laser according to claim 12, wherein the prescribed region includes one of a plurality of cylinders, a plurality of cones, a plurality of truncated cones, an m-gonal prism (m being an odd integer of 3 or more), an m-gonal pyramid (m being an odd integer of 3 or more), and an m-gonal truncated pyramid (m being an odd integer of 3 or more).

14. The laser according to claim 11, wherein the two-dimensional lattice is a square lattice.

15. The laser according to claim 11, further comprising:
    a second electrode provided on the active layer side opposite from the first electrode and including a frame part having an opening,
    wherein the laser light is emitted in a direction generally perpendicular to the active layer and passes through the opening of the second electrode.

16. A surface emitting quantum cascade laser comprising:
    an active layer with a plurality of quantum well structures stacked therein, the active layer being capable of emitting laser light by inter-subband transition;
    a first semiconductor layer provided on the active layer; and
    a first electrode provided on the first semiconductor layer and provided with a plurality of pits so as to constitute a two-dimensional lattice,
    each pit being asymmetric with respect to a line parallel to one side of the lattice, and
    the laser light having passed through the plurality of pits being emitted in a direction generally perpendicular to a surface of the first electrode.

17. The laser according to claim 14, wherein the pit is a circular hole.

18. The laser according to claim 14, wherein the pit is an s-gonal hole (s being an integer of 3 or more).

19. The laser according to claim 16, wherein a pit is provided in a region of the first semiconductor layer below the pit of the first electrode.

20. The laser according to claim 16, wherein the two-dimensional lattice is a square lattice.

* * * * *